United States Patent [19]

Cruz

[11] Patent Number: 5,195,862

[45] Date of Patent: * Mar. 23, 1993

[54] APPARATUS FOR LOADING AN UNLOADING FLAT ARTICLES WITH RESPECT TO A STORAGE CASSETTE

[75] Inventor: Didier Cruz, Grenoble, France

[73] Assignee: Commissionariat A l'Energie Atomique, Paris, France

[*] Notice: The portion of the term of this patent subsequent to Feb. 2, 2010 has been disclaimed.

[21] Appl. No.: 634,416

[22] Filed: Dec. 27, 1990

[30] Foreign Application Priority Data

Dec. 29, 1989 [FR] France ............... 89 17449

[51] Int. Cl.⁵ .............................................. B65G 65/00
[52] U.S. Cl. ............................ 414/416; 414/DIG. 3; 414/DIG. 7
[58] Field of Search ......... 414/416, 331, 627, DIG. 3, 414/DIG. 7; 901/40; 294/64.1

[56] References Cited

U.S. PATENT DOCUMENTS

| | | | |
|---|---|---|---|
| 3,318,468 | 5/1967 | Olson | 294/64.1 X |
| 3,362,706 | 1/1968 | Busse | 294/64.1 X |
| 3,929,234 | 12/1975 | Warren | 414/416 X |
| 4,530,635 | 7/1985 | Engelbrecht et al. | 294/64.1 X |
| 4,597,708 | 7/1986 | Wheeler et al. | 414/331 |
| 4,770,590 | 9/1988 | Hugues et al. | 414/331 X |
| 4,775,281 | 10/1988 | Prentakis | 414/331 X |
| 4,820,930 | 4/1989 | Tsutsui et al. | 414/416 X |
| 4,858,975 | 8/1989 | Ogawa | 294/64.1 |
| 4,900,212 | 2/1990 | Mikahara et al. | 414/416 |
| 5,030,056 | 7/1991 | Kitayama et al. | 414/416 X |

FOREIGN PATENT DOCUMENTS

| | | | |
|---|---|---|---|
| 670049 | 10/1965 | Belgium | 294/64.1 |
| 0134621 | 3/1985 | European Pat. Off. | |
| 0253162 | 1/1988 | European Pat. Off. | |
| 2567160 | 1/1986 | France | 414/627 |
| 273441 | 12/1986 | Japan | 414/416 |

Primary Examiner—David A. Bucci
Attorney, Agent, or Firm—Michael N. Meller

[57] ABSTRACT

An apparatus is provided for placing and removing flat wafers such as those used in integrated circuits in a cassette. The apparatus includes a track having a mobile part at one end thereof. The track may be horizontally inserted under one of the flat articles and the mobile part raised to contact and raise the respective article. In this way, the track can be removed from the cassette retaining the article. After the article has been appropriately processed, it can be reinserted into the cassette by moving the track back into the cassette and lowering the mobile part thereof. The flat article will then be retained on lateral supports in the cassette.

8 Claims, 4 Drawing Sheets

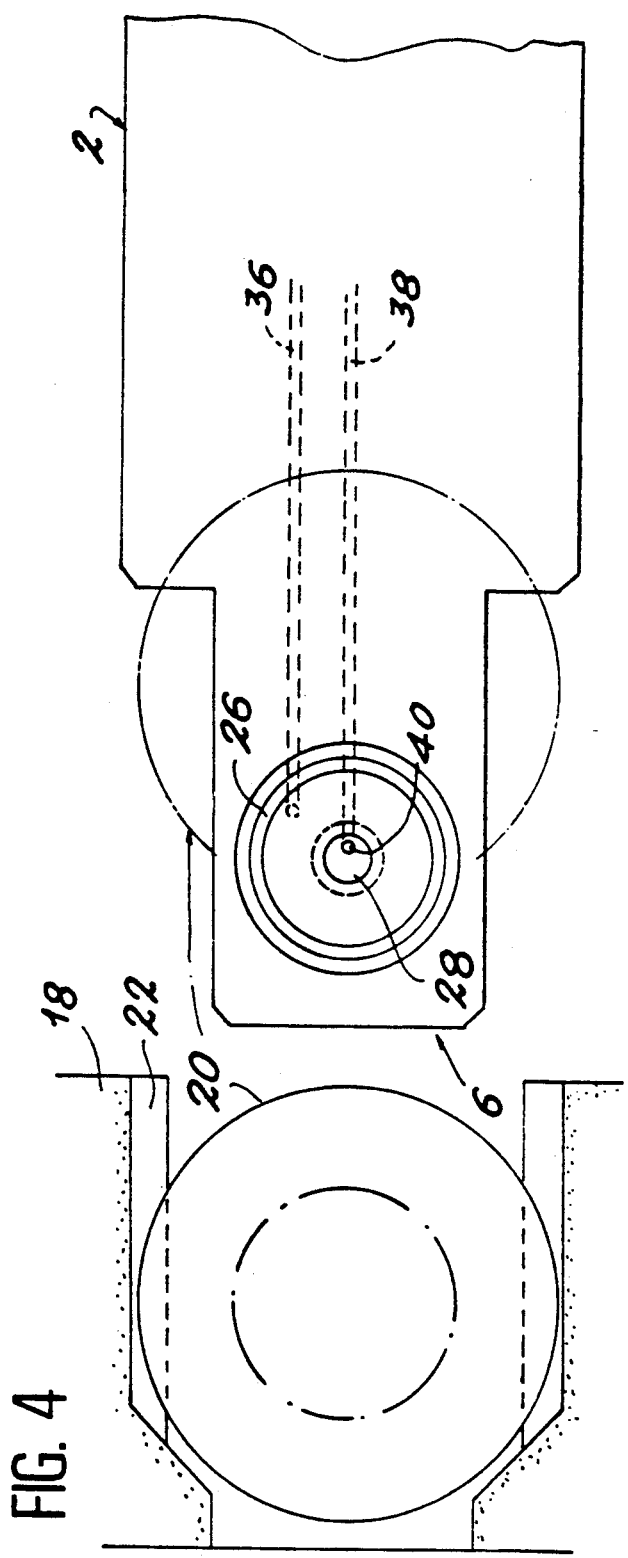
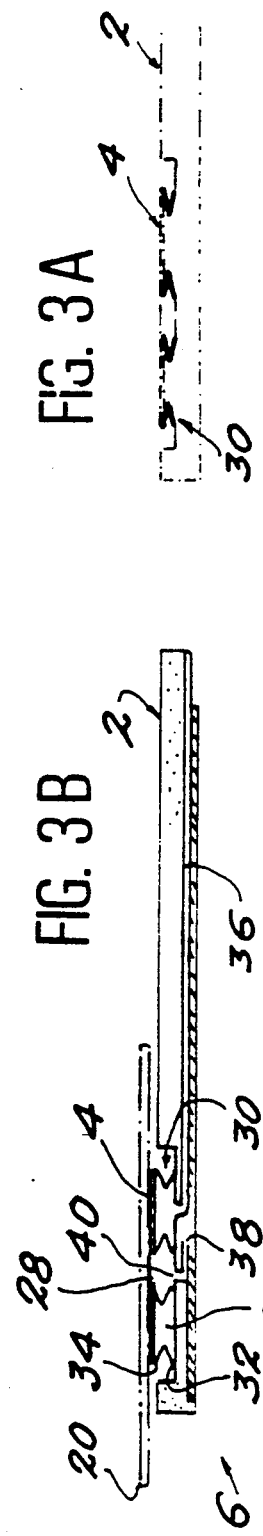

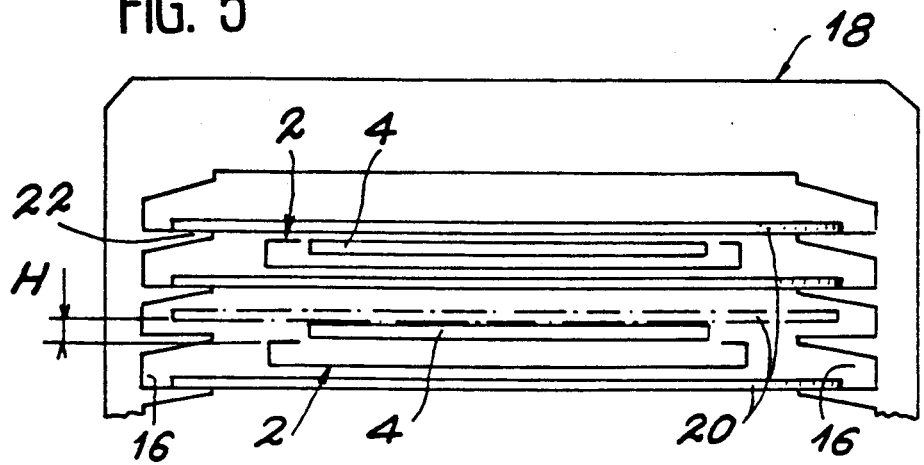
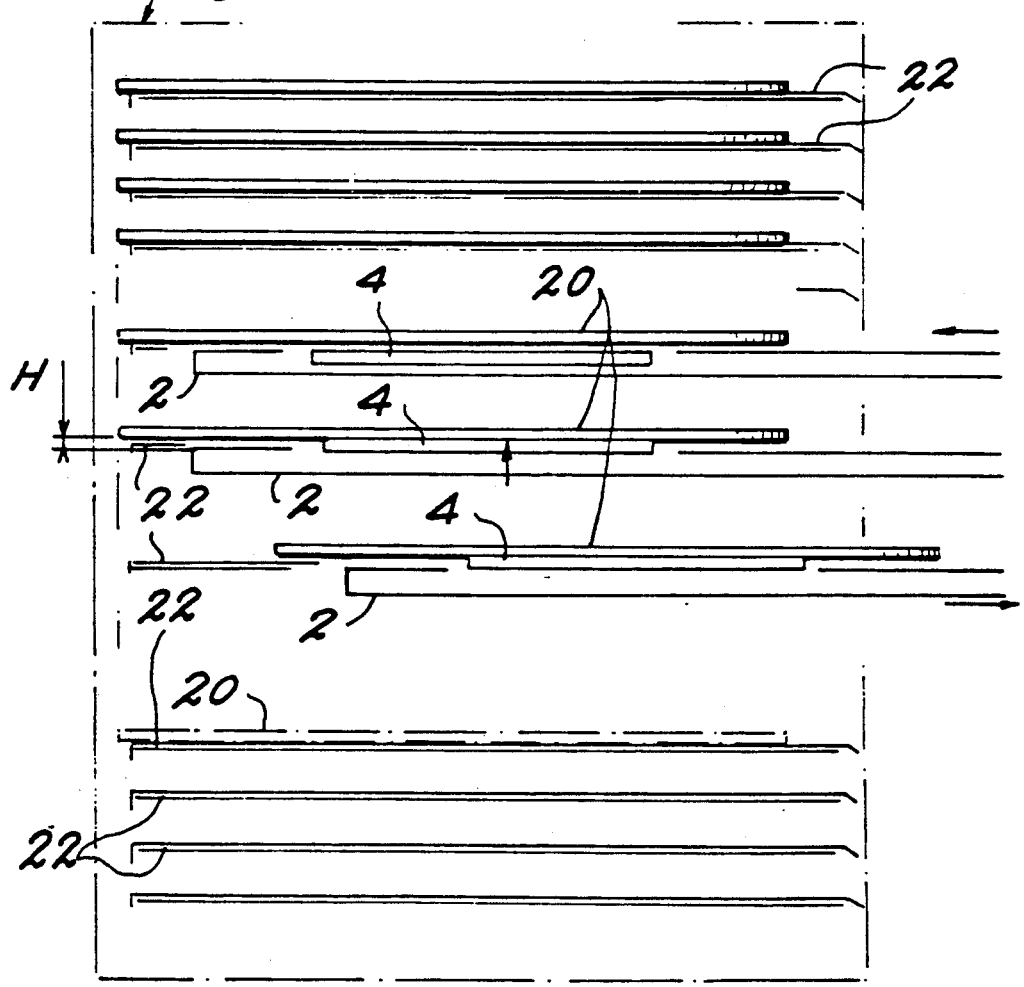

APPARATUS FOR LOADING AN UNLOADING FLAT ARTICLES WITH RESPECT TO A STORAGE CASSETTE

The field of the invention is that of handling flat articles to be placed in or removed from a cassette. It more particularly relates to the manufacture of integrated circuits, where silicon wafers are manipulated in cassettes and then have to be removed from the latter with a view to carrying out thereon other manufacturing processes.

BACKGROUND OF THE INVENTION

For the manufacture of integrated circuits on silicon wafers, the control and manipulation of the wafers takes place from storage cassettes in which they are positioned horizontally. Each cassette has a series of lateral supports able to horizontally receive the series of wafers having identical dimensions. The handling of the wafers makes it necessary to use a system making it possible to take up a wafer stored in a cassette and then place said wafer in any random cassette at any random stage.

In order to carry out these operations of gripping and putting back into place a wafer with respect to a cassette, it is known to use a gripping mechanism essentially constituted by a gripping finger able to take up a single wafer from the cassette and to put it back into place there. Bearing in mind the very limited height space separating two adjacent wafers, which is only approximately 5 mm for the "semi-engineering" standard, the movements of said gripping finger must be very precise. Thus, any gripping system must be able to penetrate beneath the wafer to be removed without scratching the upper wafer. The height positioning of the gripping finger is ensured by a very precise, but onerous mechanical device, which brings about the vertical translation of the finger and its support. The gripping finger can also remain fixed, the precise vertical translation movement then being ensured by another mechanical device moving the cassette. In the latter case, it is the precision of the cassette translation mechanism which is very costly.

A first aim of the invention is to provide an apparatus for gripping and releasing the wafer with respect to a cassette, which must be very slender, i.e. it must be able to penetrate between the racks of the cassette without any difficulty. In addition, it must be easy to manipulate and of reduced cost compared with the aforementioned gripping means.

SUMMARY OF THE INVENTION

To this end, the main object of the invention is an apparatus for loading and unloading flat articles to be stored in a storage cassette and having at least one assembly for gripping and releasing a flat article with respect to the cassette. According to the invention, each gripping and release assembly comprises a preferably pneumatic horizontal track, terminated by a gripping end and where are positioned the article gripping means. It functions by raising a mobile part of the track and in which the flat article is released by lowering again the same mobile part of the track. Thus, in this case, no movement is required on the part of the gripping means or the cassette.

A first embodiment of the gripping and release means involves the latter being completed by at least three biplates, whereof a first end is fixed to the track and whereof a second end is fixed to the mobile part of the track. An excitation of the two plates of each biplate brings about the deformation thereof and the raising of the mobile part. On returning to the rest position, the biplates reassume their initial position and the mobile part is lowered again.

The second preferred embodiment of the gripping and release means proposes the use of a deformable bellows fixed both to the track by a first end and to the mobile part by a second end. A pressure or vacuum within the bellows brings about, via the latter, the raising or lowering of the mobile part of the track.

In the case of using a deformable bellows, the latter advantageously has an external main chamber connected by a first pipe to pressurizing means for bringing about the extension thereof and the raising of the mobile part, the lowering again being brought about by the return to ambient pressure of the external chamber.

According to a feature of the invention an orifice is provided, which issues onto the upper face of the mobile part of the track and is connected to vacuum means by a second pipe, in order to create a force keeping the flat article on the mobile part of the track during the handling thereof. In this case, the deformable bellows is advantageously completed by an internal chamber issuing onto the upper surface of the mobile part by the orifice and being connected to the second pipe.

The prior art gripping means only have a single gripping finger, so that they do not permit the simultaneous manipulation of several wafers in the same cassette.

A second object of the invention is to obviate this deficiency by proposing a loading and unloading apparatus for unloading or loading a storage or transportation cassette for a predetermined number N of flat articles, which are stored parallel to one another and placed on lateral supports and which are separated from one another by a predetermined clearance E. According to the invention, there are the same number of gripping and release means as the predetermined number N of stored flat articles and are positioned horizontally, each spaced by the same height H, so that in the lowered position of the mobile part of the track, each track is positioned just below two lateral supports, in order to permit the seizing or placing of a flat article on lateral supports located just below the same.

In this case, it is possible to provide selective control means for independently actuating the gripping and release means, so as to seize or put back any random flat article placed in a cassette or on a track.

BRIEF DESCRIPTION OF THE DRAWINGS

The invention is described in greater detail hereinafter relative to non-limitative embodiments and with reference to the attached drawings, in which:

FIGS. 3A and 3B are two sectional side views of the second embodiment of the apparatus according to the invention.

FIG. 4 is an explanatory plan view of the operation of the apparatus described relative to FIGS. 3A and 3B.

FIG. 5 is a sectional front view of a cassette in which are stored flat articles and between which is inserted the apparatus according to the invention.

FIG. 6 is a lateral sectional view showing three gripping phases of a flat article in a cassette.

DESCRIPTION OF PREFERRED EMBODIMENTS

Figure 1A:
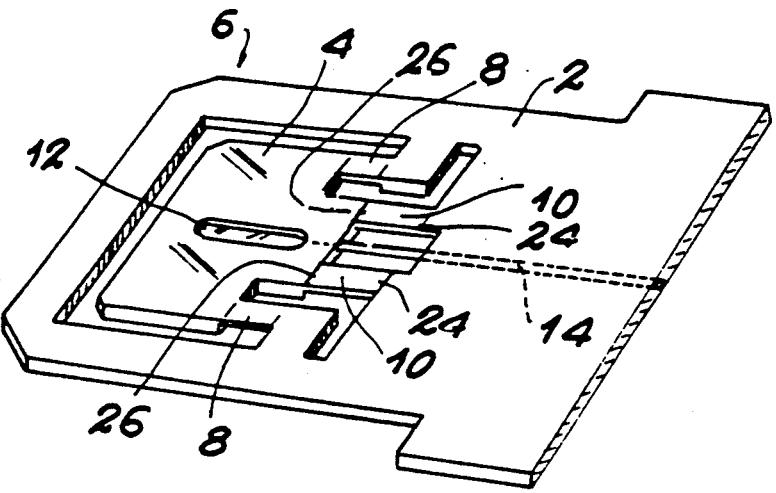
FIGS. 1A and 1B are perspective views of a first embodiment of the apparatus according to the invention.

The apparatus shown in FIG. 1A is mainly constituted by a track 2. At the end 6 is provided a means for the gripping and release of a flat article. An example of such flat articles is constituted by the silicon wafers on which integrated circuits are manufactured in the microelectronics field. Such wafers are round with a diameter of approximately 100 mm. The cassettes in which they are placed preferably have a very small distance between centres of e.g. 4.76 mm.

Figure 1B:
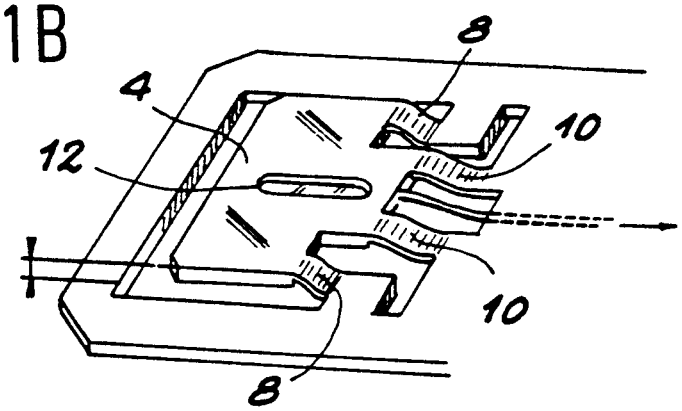

According to the invention, said gripping and release means is constituted by a mobile part 4 of the track 2. The latter can be raised and lowered again in a random manner, as a function of whether it is wished to seize or set down a flat object on two lateral supports, e.g. those of a silicon wafer storage cassette. Thus, in order to seize a flat article placed in a storage cassette 18, the gripping end 6 of the track 2 is placed beneath the flat article 20 and parallel to the latter. As is illustrated by the right-hand part of FIG. 2, the gripping end 6 of the track 2 must have a width smaller than the clearance separating the two inner walls 16 of the cassette 18, so as to permit introduction into the latter. As illustrated in FIG. 1B, the mobile part 4 is then raised until it comes into contact with the lower surface of a flat article below which is located. On continuing its rising movement, the mobile part 4 tends to raise the flat article 20 and to disengage it from the two lateral supports 22 in FIG. 2 and on which the flat article was placed. A retracting movement of the complete track to the exterior of the cassette makes it possible to extract the article 20 therefrom.

The raising of the mobile part 4 must take place in such a way that the latter remains substantially parallel to the flat article which it has to seize, i.e. parallel to the track 2 introduced parallel and below the flat article.

The first embodiment of the gripping means is completed by at least three biplates, of which there are four and which are designated 8 and 10 and FIGS. 1A and 1B. The biplates 8 and 10 are fixed by a first end 24 to the track 2. They are fixed by a second end 26 to the mobile part 4.

Such a means functions in the following way. The rest position of the biplates 8 and 10 is the flat position, i.e. they secure the mobile part 4 in the same plane as that of the track 2. When they are excited, the biplates 8 and 10 deform in such a way that their second ends 26, fixed to the mobile part 4 perform a virtually vertical upward movement, thus raising the mobile part 4. In order that the latter remains relatively parallel to the track 2, there must be at least three biplates, so that their second ends 26 fixed to the track 2 are not located on a same line, so as to define a plane. It is also necessary for the deformation of the biplates to be identical, in such a way that the second ends 26 perform a movement by the same height. A flat article can thus be raised by exciting biplates 8 and 10.

Figure 2:
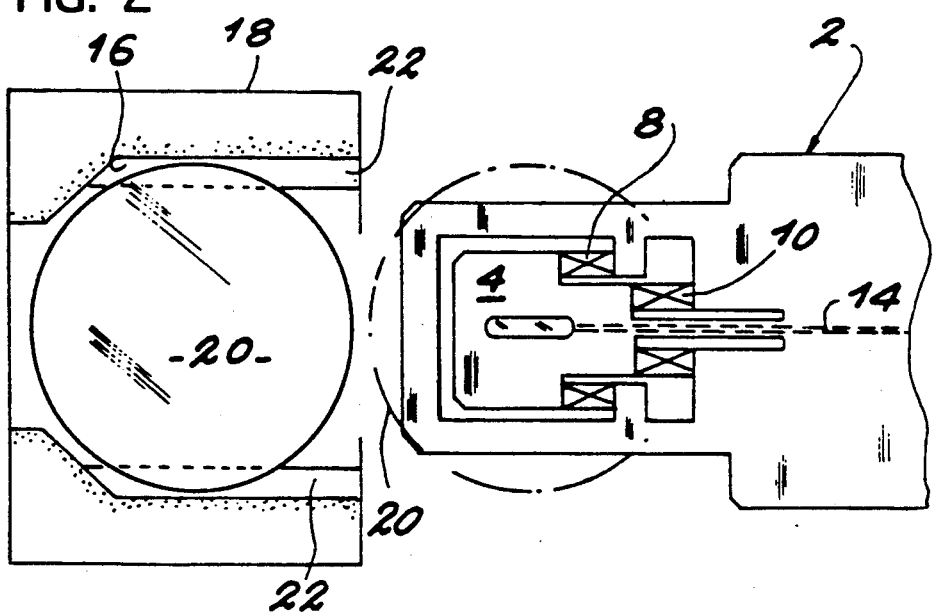
FIG. 2 is an explanatory plan view for the operation of the apparatus described relative to FIGS. 1A and 1B.

In order to again place the flat articles on the lateral supports 22 in FIG. 2, it is merely necessary to stop exciting the biplates 8 and 10, thus bringing about the lowering again of the mobile part 4. The latter returns to its rest position, but without the flat article 20, which is placed on the lateral supports 22 located slightly above the plane of the track 2.

With reference to FIG. 2, it is possible to maintain the flat article 20 on the mobile part 4 during the different manipulations of the apparatus. To this end, the mobile part 4 has a suction hole 12 issuing onto the upper surface of said part 4. This hole 12 is connected by means of a first pipe 14 to not shown vacuum-producing means. One of the pressures leading to the hole 12 creates a suction phenomenon on a flat article 20 placed on the upper surface of the mobile part 4. In the same way, the restoring to ambient pressure makes it possible to easily detach the flat articles 20 from the mobile part 4. In a second embodiment shown in FIGS. 3A, 3B and 4, a second pipe 38 leads to an orifice 40 via an internal chamber 28 of a bellows 30, placed in the centre of the main external chamber 26 of the bellows 30.

As shown in FIG. 4, the orifice 40 is preferably placed in the centre of the mobile part 4, so as to be able to centre the retention force on the flat article 20.

With reference to FIGS. 3A, 3B and 4, the second embodiment of the gripping means is essentially constituted by a pneumatic bellows 30 raising or lowering the mobile part of the track 2 and which is placed at the ends of said track 2 below the mobile part 4. The lower end 32 of the bellows 30 is fixed to the track 2. The upper end 34 of the bellows 30 is fixed to the mobile part 4. The interior of the bellows 30 is connected via a first pipe 36 located within the track 2 to not shown pressurizing means. The pressurizing of the bellow leads to the raising of the upper end 34 thereof and to the raising of a flat article 20, when the apparatus is placed just below such an article 20. The restoring to ambient pressure of the bellows 30 leads to the lowering again by gravity of the upper end 34 of the bellows 30 and therefore to the lowering again of the flat article 20. When the latter takes place above the lateral supports 22 of a cassette 18, the article 20 is placed on said supports 22.

As for the embodiment of said gripping means shown in FIGS. 3A, 3B and 4, the mobile part 4 is provided with an orifice 40 issuing onto the upper surface of the mobile part 4 and is connected by a second pipe 38 to not shown vacuum-producing means. When a vacuum exists in said pipe 38 and the orifice 40, a suction phenomenon appears on the upper surface of the mobile part 4 and creates a retention force on the flat article 20 placed on the upper surface of the mobile part 4. As a result the flat article 20 is secured during the different manipulations of the apparatus.

In this embodiment using a bellows 30, it is necessary for the latter to be collapsable or crushable in the bottom position, so that it is housed in the thickness of the track, thus permitting the insertion of the track between two adjacent flat articles located in a cassette.

On referring to FIGS. 5 and 6, it can be seen that the apparatus according to the invention is both efficient and reliable. It is shown with flat articles 20 and a cassette 18 in which they are placed and with a scale having an order of magnitude corresponding to that of the previous constructions. It can be seen that the width of the track 2 is smaller than the clearance between the internal walls 16 of the cassette 18, so as to permit insertion into the latter. Preferably, said width is smaller than that of the space defined by the ends of the lateral support 22, so as to permit an insertion of the apparatus into the cassette 18, even if the track 2 does not have an adequate height, i.e. facing a pair of lateral supports 22.

However, for carrying out the loading or unloading of a flat article 20 with respect to the cassette 18, the track 2 must be introduced in such a way that its upper surface is in a plane located just below that defined by the upper surfaces of the lateral supports 22 on which is located the object to be seized or on which it is necessary to place the flat article 20. The vertical displacement H of the mobile part 4 must be adequate to permit the disengagement of the flat article with respect to its lateral supports 22 in the case of unloading and for putting into place again in the case of loading. In both these cases, the height positioning of the track 2 with respect to the cassette 18 must take place very accurately.

FIG. 6 illustrates by the arrow oriented towards the left, the insertion of the track 2 beneath a flat article 20, the mobile part 4 being in the rest position. Just below is shown the operation of raising the mobile part 4 by a vertical movement thereof by a predetermined value H. The latter must exceed the initial height difference between the upper surface of the mobile part 4 and the upper surfaces of the lateral supports 22. Below it is shown a lateral displacement to the right of the track 2 supporting the flat article 20 in order to extract the latter from the cassette.

The thermal heating of the biplates can e.g. be obtained by a heating resistor or by the Joule effect. The deformation is instantaneous. The operation is the same for the piezoelectric biplate, which reacts instantaneously under the action of a voltage.

Therefore the apparatus according to the invention makes it possible to insert and remove flat articles to be stored in a cassette without the cassette or apparatus having to carry out vertical movements for ceasing or putting back the said article. This eliminates the presence of a raising or lowering mechanism, which would have to be very precise in order that the article did not touch adjacent articles during its manipulation. e According to the invention a loading and unloading apparatus is constructed by using several gripping and release means. Thus, a very high performance multi-track means is provided for unloading and loading cassettes with large numbers of silicon wafers during a relatively short time compared with the times necessary when these operations are carried out with unitary gripping tools. The design of such a means will now be described relative to FIGS. 7A, 7B and 8.

Figure 7A:
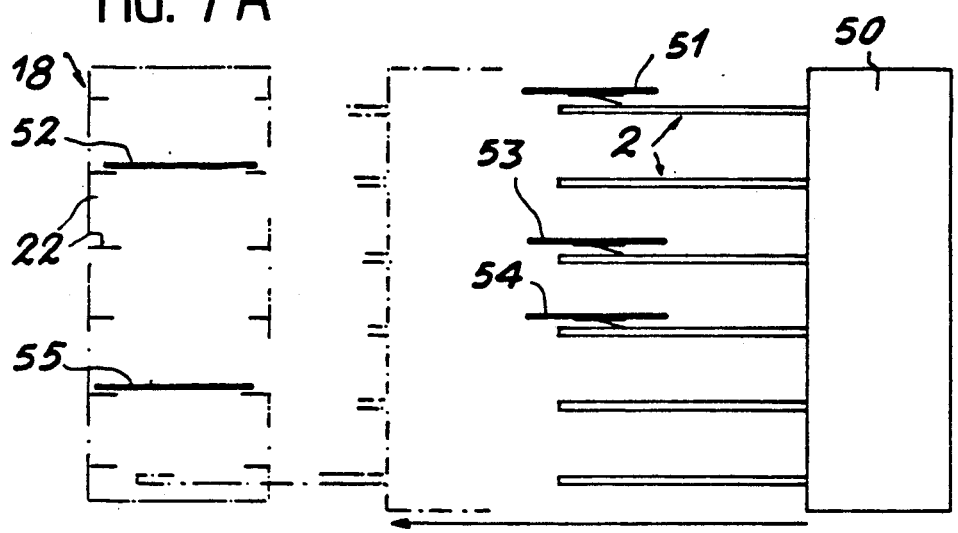
FIGS. 7A and 7B are two lateral diagrams showing the apparatus according to the invention in its multitrack version, before and after the loading and unloading of flat articles with respect to the cassette.

FIG. 7A shows an apparatus constituted by a main block 50 and tracks 2 carrying three flat articles 51, 53 and 54, respectively placed on the first, third and fourth tracks 2. The main block 50 has pressurizing and vacuum-producing means, when bellows are used. It can have vacuum-producing means and voltage generators for actuating the biplates, when the latter are used for raising the flat articles. In both cases, the main block 50 comprises selective control means, so as to be able to independently control the different gripping and release means located at the end of the tracks 2. It is very advantageous to be able to seize or put back any random article either located in the cassette 18, or on a track 2.

Figure 7B:
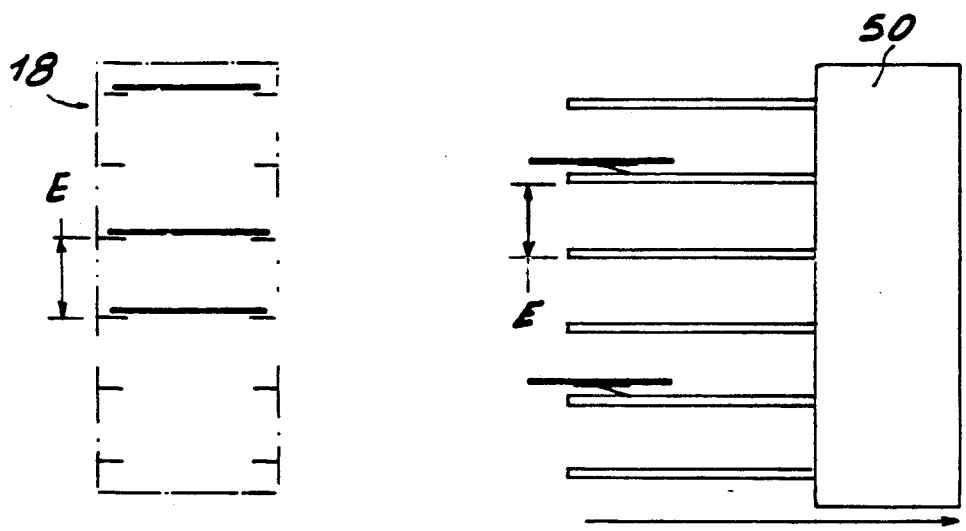

FIG. 7A shows the apparatus according to the invention moving towards a cassette 18. It carries articles 51, 53 and 54 arranged on their respective tracks 2. The end 6 of the tracks 2 is inserted into the cassette 18. The gripping and release means are then actuated in order put back the flat articles 51, 53 and 54 and for raising the flat articles 52 and 55, which are stored beforehand in the cassette 18. As illustrated by FIG. 7B, the final operation consists of the removing the apparatus from the cassette 18 by a horizontal movement being the reverse of that carried out for inserting the apparatus in the cassette 18.

The use of such an apparatus requires the presence of a predetermined number N of tracks corresponding to the same number N of racks in the cassette 18. The height positioning of each track of the apparatus must also take place as a function of the height positioning of the cassette 18. Thus, it is necessary for each track to be insertable just below two lateral supports 22 in order to be able to seize or set down a flat article on lateral supports located just above the same. The tracks 2 are separated from one another by a predetermined clearance E, which is also the height separating two lateral supports 22 in the cassette 18.

Figure 8:
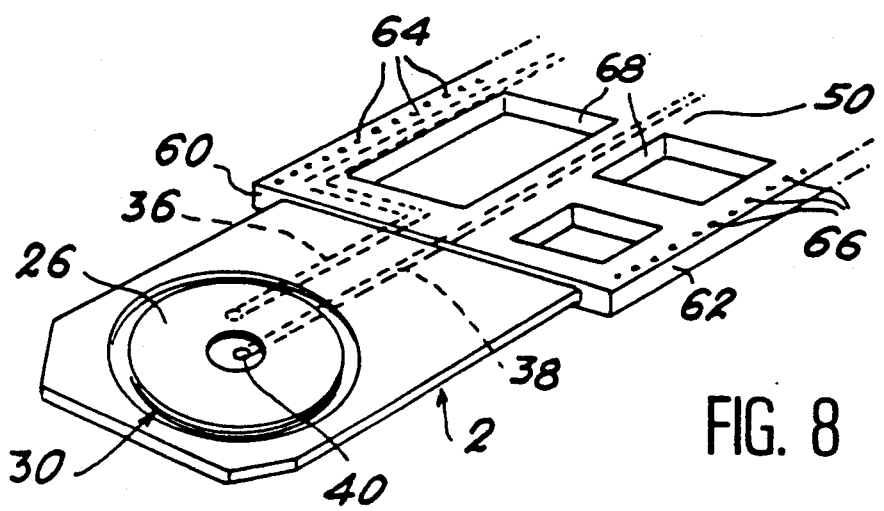
FIG. 8 is a perspective view of a possible embodiment of a track of the apparatus according to the invention in its multitrack version.

FIG. 8 shows a pneumatic gripping and release means used in a multitrack loading and unloading apparatus. It has all the elements described relative to FIGS. 3A, 3B and 4. However, it is pointed out that the track 2 is supported by a section of the main block 50. The side walls 60 and 62 thereof contain vertical ducts 64 and 66. In a first of its sides 60 each of the ducts 64 leads to a first pipe 36 supplying the main external chamber 26 of the bellows 30. Each duct 66 of the second side 62 supplies a second pipe 38 issuing, via the internal chamber 28, into the suction hole 40. Each duct 64 or 66 is connected to an electrovalve controlled by the selective control means. It is also possible to envisage the use of a microprocessor for controlling the apparatus according to the invention.

Thus, such an apparatus can make it possible to carry out "a la carte" loading and unloading operations. Therefore the operator can control or program the loading of a predetermined number of racks of a cassette, whilst being able to unload certain other racks.

FIG. 8 shows the possibility of making recesses 68 in the section of the main block 50 with a view to reducing the weight of the apparatus.

The embodiments described hereinbefore are only of an exemplified nature. The essence of the apparatus according to the invention is that a mobile part of the tracks can be raised in order to seize a flat article and can be lowered to place it on its rack.

I claim:

1. Apparatus for use in the manufacture of integrated circuits for loading and unloading thin wafers to be stored in a cassette, the apparatus having at least one gripping and release means for a wafer in said cassette, wherein each gripping and release means comprises a track movable substantially solely in a horizontal direction and adapted to be inserted under said wafer and being terminated by a gripping end, said gripping and release means including a mobile part arranged in said gripping end, said mobile part having an upper surface and a flexible portion, said mobile part being movable between a raised and a lowered position and adapted to contact said wafer at said upper surface and lift said wafer in its raised position and release said wafer in its lowered position, said mobile part lying substantially wholly within said track in its lowered position and above said track in its raised position and means for moving said mobile part between said raised and lowered positions via said flexible portion.

2. Apparatus according to claim 1, characterized in that the gripping means are completed by at least three biplates (8, 10), whereof a first end (24) is fixed to the track (2) and whereof a second end (26) is fixed to the said mobile part (4) of the track (2).

3. Apparatus according to claim 1, wherein said moving means includes at least one deformable bellows fixed both to said track by a first lower end and to said mobile part by a second upper end.

4. Apparatus according to claim 3, wherein said bellows has a main external chamber adapted to be connected by a first pipe to pressurizing means for moving said mobile part into its raised position, the lowering again of said mobile part being brought about by the restoring to ambient pressure said main external chamber.

5. Apparatus according to claim 4, wherein said mobile part has at least one orifice issuing into said upper surface of said mobile part, said orifice being adapted to be connected by a second pipe to vacuum-forming means to create a retention force of said wafer on said upper surface of said mobile part during contact with said wafer.

6. Apparatus according to claim 5, wherein said bellows has an integral chamber in contact with said upper surface of said mobile part and said orifice and being connected to said second pipe.

7. Apparatus according to claim 1 for loading and unloading a cassette having a plurality of wafers stored parallel to one another on respective horizontal lateral supports, a predetermined plurality (N) of said lateral supports being separated from one another by a predetermined clearance (E), said apparatus including said predetermined plurality (N) of horizontally positioned gripping and release means, said gripping and release means being vertically spaced from each other by said clearance (E), so that when said mobile part of said track is lowered, each track is located below two respective lateral supports, so as to be able to grip or release a wafer on said lateral supports placed just above said track.

8. Apparatus according to claim 7, wherein each of said gripping and release means includes a first and a second duct adapted to be connected to selective control means for independently actuating each of said gripping and release means, in order to grip or release any random wafer placed on said cassette or on a track.

* * * * *